(12) United States Patent
Kobayashi et al.

(10) Patent No.: US 9,024,923 B2
(45) Date of Patent: May 5, 2015

(54) LIQUID CRYSTAL DISPLAY PANEL AND LIQUID CRYSTAL DISPLAY DEVICE WITH BACKLIGHT CHROMATICITY BALANCE

(71) Applicants: Panasonic Liquid Crystal Display Co., Ltd., Hyogo (JP); Panasonic Corporation, Osaka (JP)

(72) Inventors: Takahiro Kobayashi, Osaka (JP); Yoshio Umeda, Hyogo (JP); Katuji Tanaka, Osaka (JP)

(73) Assignees: Panasonic Liquid Crystal Display Co., Ltd., Hyogo (JP); Panasonic Corporation, Osaka (JP)

( * ) Notice: Subject to any disclaimer, the term of this patent is extended or adjusted under 35 U.S.C. 154(b) by 154 days.

(21) Appl. No.: 13/715,960

(22) Filed: Dec. 14, 2012

(65) Prior Publication Data

US 2013/0155040 A1 Jun. 20, 2013

(30) Foreign Application Priority Data

Dec. 14, 2011 (JP) ................................. 2011-273569

(51) Int. Cl.
*G09G 3/34* (2006.01)
*F21V 8/00* (2006.01)
(Continued)

(52) U.S. Cl.
CPC ........ *G02F 1/133603* (2013.01); *G02B 6/0073* (2013.01); *G09G 5/00* (2013.01); *G09G 3/342* (2013.01); *G09G 2320/0242* (2013.01); *G09G 3/3413* (2013.01); *G02B 6/0083* (2013.01); *G09G 3/3406* (2013.01); *G09G 2320/0233* (2013.01); *G09G 2320/045* (2013.01)

(58) Field of Classification Search
CPC ... G09G 3/3406; G09G 3/3413; G09G 3/342; G09G 3/3426; G02F 1/133602; G02F 1/133603; G02B 6/0068; G02B 6/0073; G02B 6/0083; H01L 25/048
USPC ............ 345/102, 690, 204; 315/169.3, 169.4, 315/250, 77, 287; 348/801
See application file for complete search history.

(56) References Cited

U.S. PATENT DOCUMENTS 7,126,562 B1 * 10/2006 Irie et al. .......................... 345/63
2007/0120496 A1 * 5/2007 Shimizu et al. ............. 315/169.3
(Continued)

FOREIGN PATENT DOCUMENTS

JP 2008218485 A 9/2008

*Primary Examiner* — Ariel Balaoing
*Assistant Examiner* — Darlene M Ritchie
(74) *Attorney, Agent, or Firm* — McDermott Will & Emery LLP

(57) ABSTRACT

The liquid crystal display panel includes a liquid crystal display unit, and a backlight unit illuminating the liquid crystal display unit. The backlight unit includes first and second white light-emitting diodes that respectively emit white light, and first and second drive units that respectively supply a current to the first and second white light-emitting diodes. The first and second drive units are respectively configured to be able to adjust supply current to the first and second white light-emitting diodes. Chromaticities of the first and second white light-emitting diodes are of a relationship of being positioned opposite each other across a blackbody locus on an xy chromaticity diagram. The first and second white light-emitting diodes change over time so that, on the xy chromaticity diagram, an intersection point of the blackbody locus and a line that passes through the chromaticities of the first and second white light-emitting diodes becomes constant.

19 Claims, 7 Drawing Sheets

(51) Int. Cl.
*G09G 5/00* (2006.01)
*G02F 1/1335* (2006.01)

(56) References Cited

U.S. PATENT DOCUMENTS

| | | | |
|---|---|---|---|
| 2007/0268234 A1* | 11/2007 | Wakabayashi et al. | 345/102 |
| 2009/0033612 A1* | 2/2009 | Roberts et al. | 345/102 |
| 2009/0140656 A1* | 6/2009 | Kohashikawa et al. | 315/151 |
| 2010/0156959 A1* | 6/2010 | Tanahashi | 345/690 |
| 2010/0277410 A1* | 11/2010 | You et al. | 345/102 |
| 2010/0295464 A1* | 11/2010 | Kasakura et al. | 315/287 |
| 2011/0101881 A1* | 5/2011 | Kamikawa et al. | 315/250 |
| 2011/0157492 A1* | 6/2011 | Shin et al. | 348/801 |
| 2011/0242453 A1* | 10/2011 | Van De Ven et al. | 349/62 |
| 2013/0088522 A1* | 4/2013 | Gettemy et al. | 345/690 |
| 2013/0162140 A1* | 6/2013 | Shamoto et al. | 315/77 |

* cited by examiner

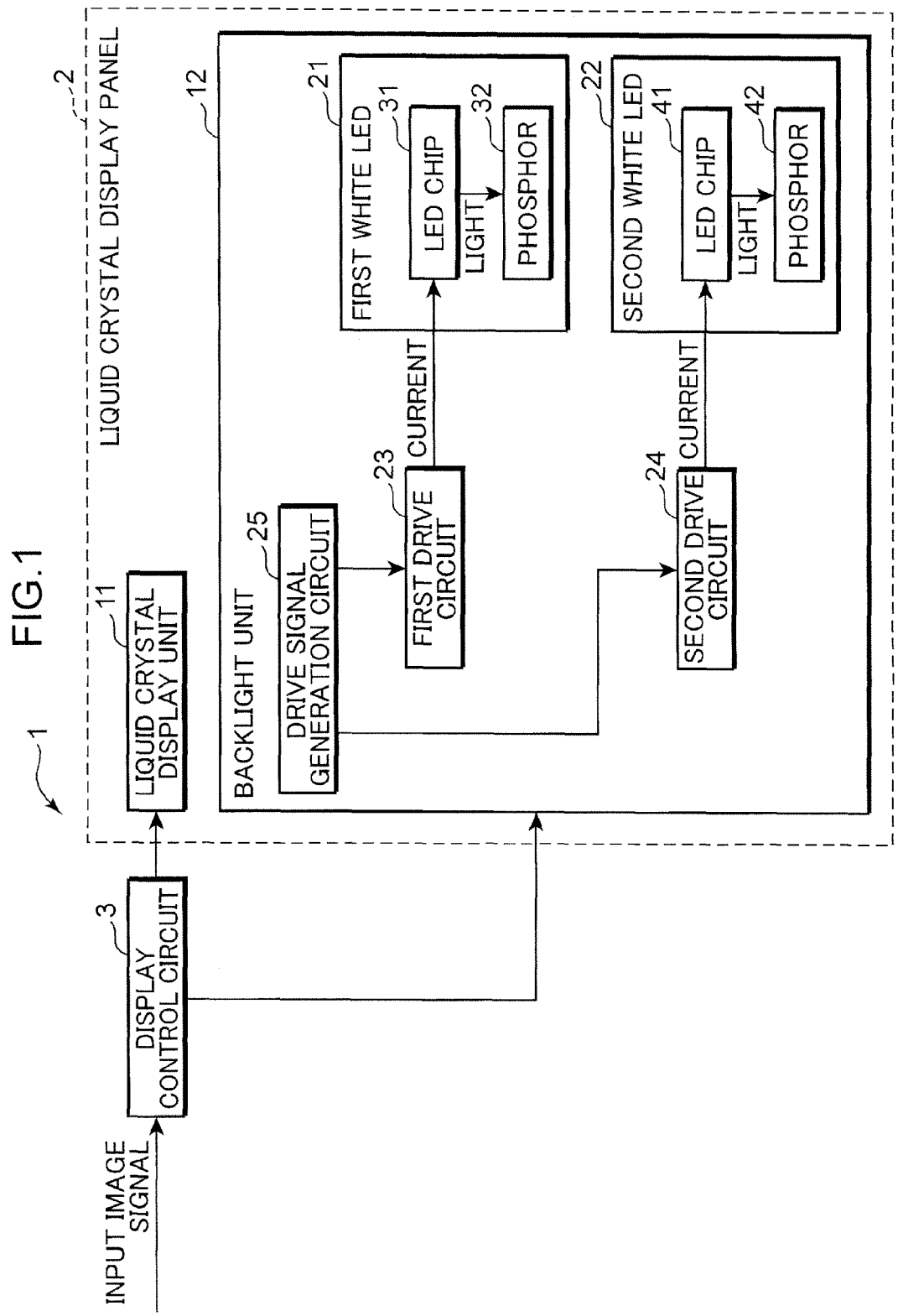

US 9,024,923 B2

LIQUID CRYSTAL DISPLAY PANEL AND LIQUID CRYSTAL DISPLAY DEVICE WITH BACKLIGHT CHROMATICITY BALANCE

BACKGROUND

1. Technical Field

This disclosure relates to a liquid crystal display panel for displaying a video picture on a liquid crystal display unit, and to a liquid crystal display device provided with such a liquid crystal display panel.

2. Description of the Related Art

A liquid crystal display panel including a liquid crystal display unit which uses liquid crystals as the optical modulator comprises a backlight unit for illuminating the liquid crystal display unit from a rear face, and realizes the display of arbitrary images by changing the transmittance of the illumination light from the backlight unit with the respective liquid crystals.

As this kind of backlight unit, a liquid crystal module using a light-emitting diode (LED) as the light source is becoming widely prevalent. Today, the LED that is used as the backlight unit is often an LED which emits white light. A white LED usually obtains a white light by applying phosphors of yttrium, aluminum and garnet (YAG) or the like on a GaN-based blue LED chip, and synthesizing blue and yellow. Moreover, in recent years, the emission efficiency and color reproducibility are being improved by using a new phosphor or mixing phosphor which strongly emits red or green with the YAG phosphor. For example, Japanese Patent Application Publication No. 2008-218485 proposes a light-emitting device capable of maintaining high color rendering properties and changing the color temperature.

While an LED has a long service life, when it is used for several ten thousand hours, the light emission luminance decreases about several tens percent. With consumer equipment such as TVs and mobile phones, even if the luminance decreases, the equipment is used as is without correcting the luminance. However, with medical equipment and broadcast equipment, the decreases in luminance is unacceptable. Thus, normally, the luminance is stabilized by increasing the supply current to the LED for each given period of use or other methods. The LED has, in general, an upper limit value (allowable current) of the current that can be supplied. Accordingly, for instance, a method is adopted where, at the beginning of use, light is emitted at a current value that is ½ of the allowable current, and the supply current is increased according to the decrease in the light emission luminance. Otherwise, a method is adopted where, at the beginning of use, the allowable current is supplied at 50% of the lighting duty ratio, and the lighting duty ratio is increased according to the decrease of the light emission luminance.

The luminance of an LED can be stabilized, without causing the gradation to deteriorate, by increasing the supply current to the LED or increasing the lighting duty ratio as described above. On the other hand, with an LED, there are cases where the chromaticity changes, similar to the luminance, due to a temporal change. Similar to the case of luminance, with consumer equipment such as TVs and mobile phones, even if the chromaticity changes, the equipment is used as is without correcting the chromaticity. However, with medical equipment and broadcast equipment, the change in chromaticity is unacceptable as with the decrease in luminance, and in particular the change in the chromaticity point of white is unacceptable. Thus, it is necessary to inhibit changes in the chromaticity. However, the foregoing Japanese Patent Application Publication No. 2008-218485 does not in any way describe the inhibition of changes to the chromaticity caused by a temporal change of the LED.

SUMMARY

In one general aspect, the instant application describes a liquid crystal display panel that includes a liquid crystal display unit that includes a display screen that displays an image; and a backlight unit that illuminates the liquid crystal display unit from a rear face of the liquid crystal display unit. The backlight unit includes: a first white light-emitting diode and a second white light-emitting diode that respectively emit white light; a first drive unit that supplies a current to the first white light-emitting diode; and a second drive unit that supplies a current to the second white light-emitting diode, the first drive unit is configured to be able to adjust a supply current to the first white light-emitting diode, the second drive unit is configured to be able to adjust a supply current to the second white light-emitting diode, a chromaticity of the first white light-emitting diode and a chromaticity of the second white light-emitting diode are of a relationship of being positioned opposite each other across a blackbody locus on an xy chromaticity diagram, and the first white light-emitting diode and the second white light-emitting diode change over time so that, on the xy chromaticity diagram, an intersection point of the blackbody locus and a line that passes through the chromaticity of the first white light-emitting diode and the chromaticity of the second white light-emitting diode becomes constant.

In another general aspect, the instant application describes a liquid crystal display device that includes the liquid crystal display panel and a control circuit that controls the liquid crystal display unit of the liquid crystal display panel based on an input image signal.

A liquid crystal display of the instant application can prevent the synthetic chromaticity of the light from the backlight unit from changing even when the respective chromaticities of the first and second white light-emitting diodes move on the xy chromaticity diagram due to a temporal change.

BRIEF DESCRIPTION OF THE DRAWINGS

FIG. 1 is a block diagram showing a configuration of a liquid crystal display device according to an embodiment of the instant application;

FIGS. 2A and 2B are diagrams showing a liquid crystal display panel, wherein FIG. 2A is a side view and FIG. 2B is a rear view;

FIGS. 12A and 12B are diagrams showing a liquid crystal display panel comprising a direct-type backlight unit, wherein FIG. 12A is a side view and FIG. 12B is a rear view.

DETAILED DESCRIPTION

Figure 2A:
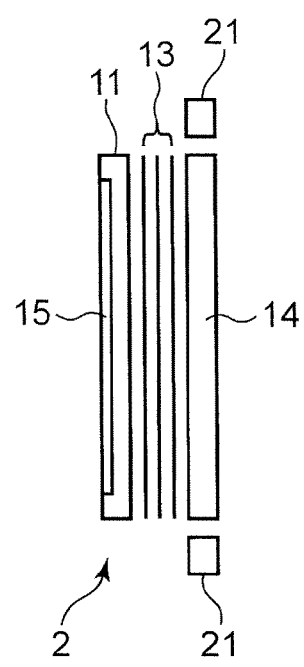
Figure 2B:
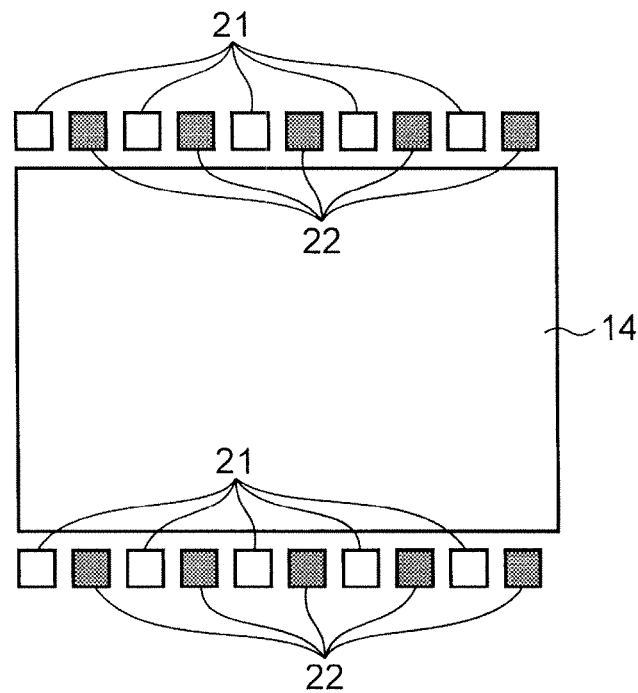
Figure 3:
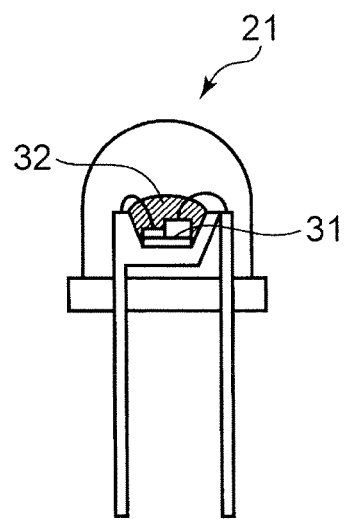
FIG. 3 is a diagram showing a configuration of a first white light-emitting diode.

FIG. 1 is a block diagram showing a configuration of a liquid crystal display device according to an embodiment of the present application. FIGS. 2A and 2B are diagrams showing a liquid crystal display panel. FIG. 2A is a side view and FIG. 2B is a rear view. FIG. 3 is a diagram showing a configuration of a first white light-emitting diode. As shown in FIG. 1, the liquid crystal display device 1 comprises a liquid crystal display panel 2 and a display control circuit 3.

The liquid crystal display panel 2 includes a liquid crystal display unit 11, a backlight unit 12, an optical sheet 13 and a light guide plate 14. The liquid crystal display unit 11 displays images on a display screen 15 based on input image signals. The liquid crystal display unit 11 comprises the following components not shown; namely, a plurality of gate signal lines, a plurality of source signal lines, a plurality of pixels, a gate drive unit for driving the gate signal lines, and a source drive unit for driving the source signal lines. The plurality of gate signal lines are respectively extending in a horizontal direction (main scanning direction), and provided in alignment in a vertical direction (sub scanning direction). The plurality of source signal lines are respectively extending in a vertical direction (sub scanning direction), and provided in alignment in a horizontal direction (main scanning direction). A plurality of pixels in a matrix are disposed at an intersection point of the plurality of gate signal lines and the plurality of source signal lines.

The backlight unit 12 includes a first white light-emitting diode (hereinafter referred to as the "first white LED") 21, a second white light-emitting diode (hereinafter referred to as the "second white LED") 22, a first drive circuit 23, a second drive circuit 24 and a drive signal generation circuit 25. The optical sheet 13 is disposed on a rear face side of the liquid crystal display unit 11. The light guide plate 14 is disposed further on the rear face side of the optical sheet 13. As shown in FIG. 2B, the first white LED 21 and the second white LED 22 are alternately disposed along an upper end and a lower end of the light guide plate 14 in FIG. 2B. Light emitted from the first white LED 21 and the second white LED 22 are diffused and guided by the light guide plate 14 to the optical sheet 13, and illuminate the liquid crystal display unit 11 from the rear face while being further diffused by the optical sheet 13. The backlight unit 12 will be described in detail later.

The display control circuit 3 controls the foregoing gate drive unit and source drive unit based on the input image signals to write image data once per frame in the pixels, which are disposed in a matrix, of the liquid crystal display unit 11. The gate drive unit applies a scan voltage to sequentially select the gate signal line from top to bottom. The source drive unit applies a voltage corresponding to the image data via the source signal line to the respective pixels corresponding to the gate signal line that is being selected by the gate drive unit. Consequently, a voltage corresponding to the image data is applied to the liquid crystal layer of the respective pixels, and the transmittance of the respective pixels is thereby controlled. As a result of the selection of the gate signal line from top to bottom being completed by the gate drive unit, image data based on input image signals is written in all pixels once. An image of one frame is generated by the image data being written in all pixels. The liquid crystal display unit 11 is a hold-type display unit which holds the written image data for one frame period up to the writing of the subsequent image data.

As a result of the image generation of one frame being repeated at a predetermined frame frequency by the display control circuit 3, the image displayed on the liquid crystal display unit 11 can be visually recognized by the viewer. Note that, as the liquid crystal display unit 11, the in plane switching (IPS) system, vertical alignment (VA) system, or other systems may be applied.

The respective elements configuring the backlight unit 12 are now described with reference to FIG. 1 and FIG. 3. The first white LED 21 includes an LED chip 31 and a phosphor 32. The LED chip 31 is formed, for example, from GaN series, and emits near-ultraviolet light. The phosphor 32 includes a red phosphor, a green phosphor and a blue phosphor having a predetermined material and composition. The phosphor 32 absorbs a part of the near-ultraviolet light emitted from the LED chip 31, and emits a three-color visible light. The first white LED 21 emits a white light by means of the three-color visible light emitted from the phosphor 32 which is excited by the near-ultraviolet light emitted from the LED chip 31.

The second white LED 22 has the exact same structure as the first white LED 21, and includes an LED chip 41 and a phosphor 42. The LED chip 41 is formed from the exact same material as the material configuring the LED chip 31. Moreover, the composition of the material forming the LED chip 41 is the exact same as the composition of the material configuring the LED chip 31. Accordingly, the second white LED 22 emits a white light by means of the three-color visible light emitted from the phosphor 42 which is excited by the near-ultraviolet light emitted from the LED chip 41.

The first drive circuit 23 supplies a current to the LED chip 31 to cause the LED chip 31 to emit light. The second drive circuit 24 supplies a current to the LED chip 41 to cause the LED chip 41 to emit light. The drive signal generation circuit 25 supplies drive signals to the first drive circuit 23 and the second drive circuit 24 based on the control signals from the display control circuit 3. The first drive circuit 23 and the second drive circuit 24 respectively supply current to the LED chip 31 and the LED chip 41, in accordance with the drive signals supplied from the drive signal generation circuit 25. The drive signal generation circuit 25 is configured to be able to supply the drive signals individually to the first drive circuit 23 and the second drive circuit 24. Based on this configuration, the first drive circuit 23 and the second drive circuit 24 are configured to be able to respectively supply current to the LED chip 31 and the LED chip 41 having a different current value.

Figure 4:
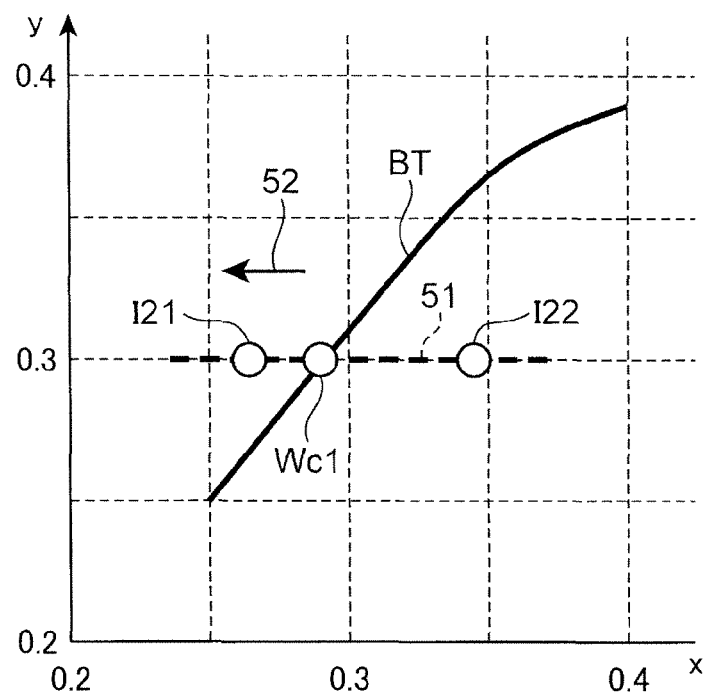
FIG. 4 is an xy chromaticity diagram of CIE showing the chromaticity points at the beginning of use of the first and second white LEDs and the blackbody locus.

FIG. 4 is an xy chromaticity diagram of International Commission on Illumination (CIE) showing the chromaticity points at the beginning of use of the first and second white LEDs 21, 22 and the blackbody locus. As shown in FIG. 4, a chromaticity point (also referred to as a chromaticity coordinate) I21 of the first white LED 21 at the beginning of use and a chromaticity point I22 of the second white LED 22 at the beginning of use are of a relationship of being positioned opposite each other across the blackbody locus BT on the xy chromaticity diagram. In addition, a straight line 51 (broken line in FIG. 4) that passes through the chromaticity point I21 of the first white LED 21 and the chromaticity point I22 of the second white LED 22 is parallel to a moving direction 52, which is the direction that the chromaticity points I21, I22 of the first and second white LEDs 21, 22 move due to a temporal change.

In general, when LEDs are manufactured using the same material and in which the composition of that material is the same, LEDs having different chromaticity points and a wide distribution are manufactured depending on the wavelength of the light emitted from the LED chip and the film thickness of the phosphor. Accordingly, it is possible to relatively easily acquire two types of white LEDs having chromaticity points of a relationship of being positioned opposite each other across the blackbody locus BT on the xy chromaticity diagram. Moreover, it is known that the chromaticity points of LEDs that are manufactured using the same material and so that the composition of that material will be the same show characteristics of moving the same direction on the xy chromaticity diagram due to a temporal change even when the chromaticity points at the beginning of use are different.

The first white LED 21 and the second white LED 22 of this embodiment change over time so that their respective chromaticity points move on the straight line 51 that passes through the chromaticity point I21 of the first white LED 21 at the beginning of use and the chromaticity point I22 of the second white LED 22 at the beginning of use on the xy chromaticity diagram. In this embodiment, the display control circuit 3 corresponds to an example of a control circuit, the first drive circuit 23 corresponds to an example of a first drive unit, and the second drive circuit 24 corresponds to an example of a second drive unit.

Figure 5:
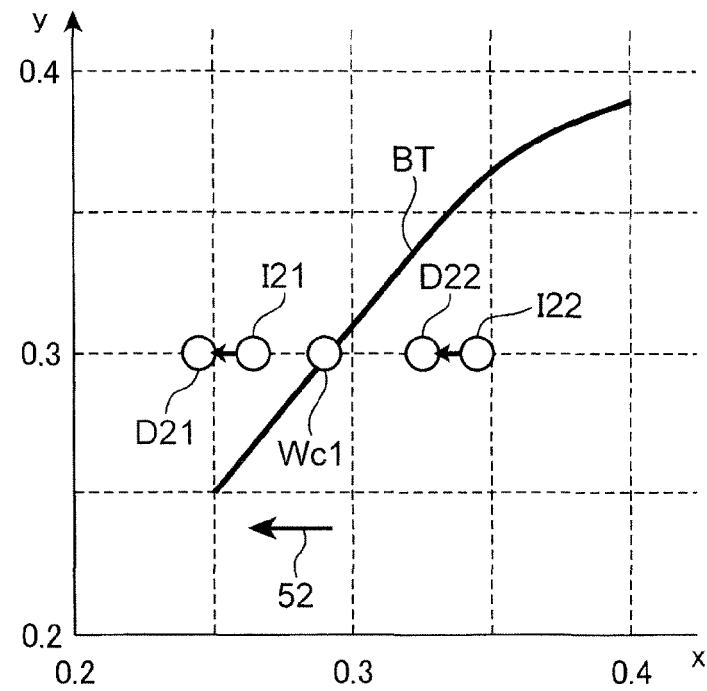
FIG. 5 is an xy chromaticity diagram of CIE showing the chromaticity points at the beginning of use of the first and second white LEDs of FIG. 4, the chromaticity points after a temporal change, and the blackbody locus.

FIG. 5 is an xy chromaticity diagram of CIE showing the chromaticity points at the beginning of use of the first and second white LEDs 21, 22 of FIG. 4, the chromaticity points after a temporal change, and the blackbody locus. The correction method of the chromaticity of the illumination light from the backlight unit 12 in this embodiment is now described with reference to FIG. 4 and FIG. 5.

In FIG. 4, at the beginning of use of the liquid crystal display device 1, a current of, for example, 50 mA is supplied from the first drive circuit 23 to the LED chip 31, and a current of 150 mA is supplied from the second drive circuit 24 to the LED chip 41. Consequently, a synthetic chromaticity Wc1 on the blackbody locus BT is obtained as the synthetic chromaticity of the first white LED 21 and the second white LED 22. In other words, the backlight unit 12 illuminates the liquid crystal display unit 11 from the rear face with the light of the synthetic chromaticity Wc1.

When time elapses from the start of use of the liquid crystal display device 1, due to the deterioration in the red phosphor among the phosphors 32, 42 of the first and second white LEDs 21, 22, let it be assumed that the chromaticity points I21, I22 of the first and second white LEDs 21, 22 respectively move in the moving direction 52 on the xy chromaticity diagram, and become chromaticity points D21, D22. Specifically, the chromaticity point of the first white LED 21 changes from the chromaticity point I21 to the chromaticity point D21, and moves away from the blackbody locus BT in the moving direction 52. On the other hand, the chromaticity point of the second white LED 22 changes from the chromaticity point I22 to the chromaticity point D22, and approaches the blackbody BT in the moving direction 52. However, the chromaticity point D21 of the first white LED 21 after deterioration and the chromaticity point D22 of the second white LED 22 after deterioration are still of a relationship of being positioned opposite each other across the blackbody locus BT on the xy chromaticity diagram.

In the foregoing case, the respective drive signals supplied from the drive signal generation circuit 25 to the first drive circuit 23 and the second drive circuit 24 are changed so that the current supplied from the first drive circuit 23 to the LED chip 31 is increased and the current supplied from the second drive circuit 24 to the LED chip 41 is decreased. And, a current of, for example, 120 mA is supplied from the first drive circuit 23 to the LED chip 31, and a current of 100 mA is supplied from the second drive circuit 24 to the LED chip 41. Consequently, the synthetic chromaticity Wc1 on the blackbody locus BT, that is, the same synthetic chromaticity as the beginning of use, is obtained as the synthetic chromaticity of the first white LED 21 and the second white LED 22. In other words, the first white LED 21 and the second white LED 22 change over time so that the respective chromaticities move on the straight line 51 that passes through the chromaticity point I21 of the first white LED 21 and the chromaticity point I22 of the second white LED 22. Consequently, even in cases where the first and second white LEDs 21, 22 deteriorate, the intersection point of the straight line that passes through the chromaticity point D21 of the first white LED 21 and the chromaticity point D22 of the second white LED 22 after deterioration, and the blackbody locus BT becomes constant (Wc1).

As described above, in this embodiment, the LED chip 41 of the second white LED 22 is formed from the exact same material as the material forming the LED chip 31 of the first white LED 21. Moreover, the composition of the material forming the LED chip 41 is the exact same as the composition of the material forming the LED chip 31. In addition, the phosphor 42 of the second white LED 22 is formed from the exact same material as the material forming the phosphor 41 of the first white LED 21. Moreover, the composition of the material forming the phosphor 42 is formed from the exact same composition of the material forming the phosphor 41. Accordingly, the chromaticity point of the white light emitted from the first white LED 21 and the chromaticity point of the white light emitted from the second white LED 22, due to a temporal change, move in the same direction on the xy chromaticity diagram.

In addition, in this embodiment, the chromaticity point of the white light emitted from the first white LED 21 and the chromaticity point of the white light emitted from the second white LED 22 at the beginning of use are of a relationship of being positioned opposite each other across the blackbody locus BT on the xy chromaticity diagram. Moreover, the first drive circuit 23 which supplies a current to the LED chip 31 of the first white LED 21 and the second drive circuit 24 which supplies a current to the LED chip 41 of the second white LED 22 are respectively configured to be able to individually change supply current.

Thus, according to this embodiment, even when the chromaticity point of the white light emitted from the first white LED 21 and the chromaticity point of the white light emitted from the second white LED 22 change due to a temporal change of the first white LED 21 and the second white LED 22, the synthetic chromaticity at the beginning of use can be maintained by respectively adjusting the currents supplied from the first drive circuit 23 and the second drive circuit 24.

Accordingly, the liquid crystal display device 1 can be suitably used in medical equipment and broadcast equipment.

Moreover, in this embodiment, as shown in FIG. 2, the first white LED 21 and the second white LED 22 are alternately disposed along the end part of the light guide plate 14. Accordingly, there is an advantage in that the color unevenness caused by the difference in the chromaticity point I21 of the first white LED 21 and the chromaticity point I22 of the second white LED 22 will not be conspicuous.

Note that, while the foregoing embodiment describes a case where the red phosphor has deteriorated among the phosphors 32, 42 of the first and second white LEDs 21, 22, the present application is not limited thereto. The present application can also be applied, for instance, to a case where the green phosphor deteriorates.

Figure 6:
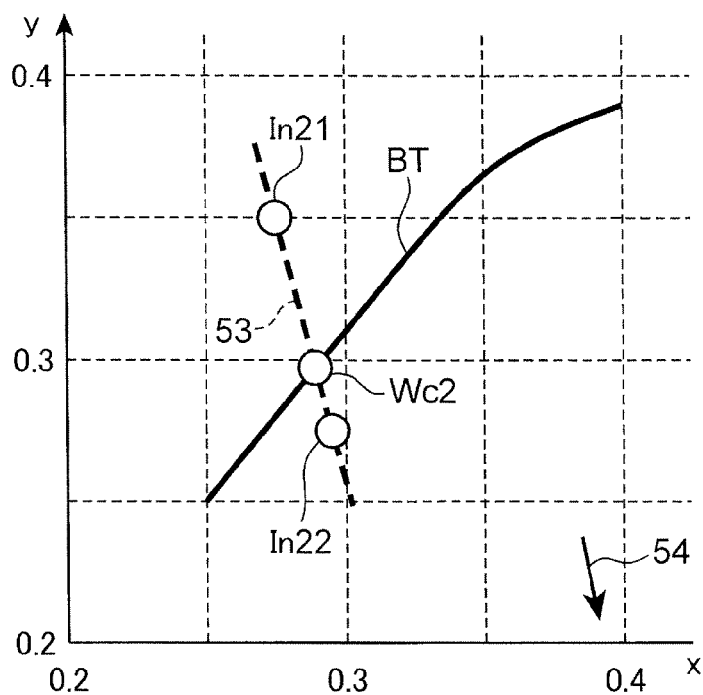
FIG. 6 is an xy chromaticity diagram of CIE showing another example of the chromaticity points at the beginning of use of the first and second white LEDs and the blackbody locus.
Figure 7:
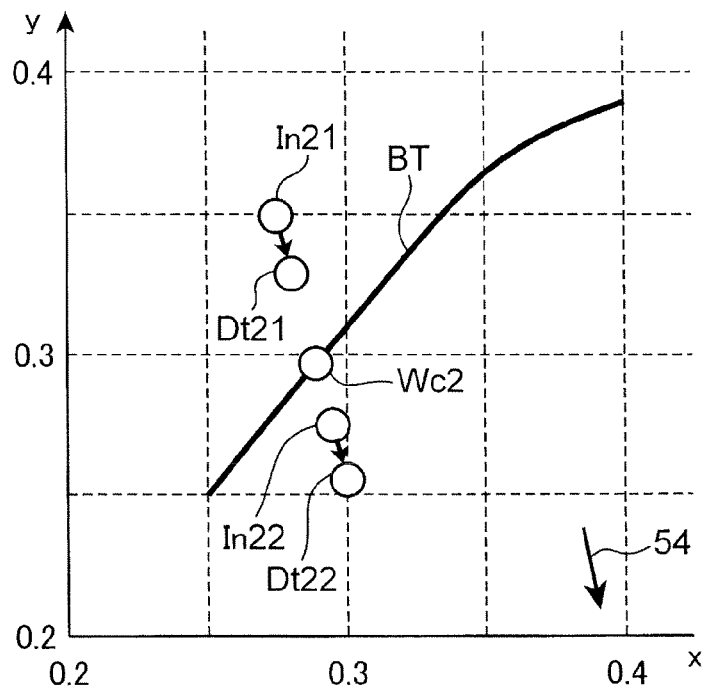
FIG. 7 is an xy chromaticity diagram of CIE showing the chromaticity points at the beginning of use of the first and second white LEDs of FIG. 6, the chromaticity points after a temporal change, and the blackbody locus.

FIG. 6 is an xy chromaticity diagram of CIE showing another example of the chromaticity points at the beginning of use of the first and second white LEDs 21, 22 and the blackbody locus. FIG. 7 is an xy chromaticity diagram of CIE showing the chromaticity points at the beginning of use of the first and second white LEDs 21, 22 of FIG. 6, the chromaticity points after a temporal change, and the blackbody locus. The correction method of the chromaticity points in this modified embodiment is now described with reference to FIG. 6 and FIG. 7.

As shown in FIG. 6, a chromaticity point In21 of the first white LED 21 at the beginning of use and a chromaticity point In22 of the second white LED 22 at the beginning of use are, as with the case of FIG. 4, of a relationship of being positioned opposite each other across the blackbody locus BT on the xy chromaticity diagram. In addition, a straight line 53 (broken line in FIG. 6) that passes through the chromaticity point In21 of the first white LED 21 and the chromaticity point In22 of the second white LED 22 is parallel to a moving direction 54, which is the direction that the chromaticity points In21, In22 of the first and second white LEDs 21, 22 move due to a temporal change.

In FIG. 6, at the beginning of use, a current of, for example, 150 mA is supplied from the first drive circuit 23 to the LED chip 31, and a current of 50 mA is supplied from the second drive circuit 24 to the LED chip 41. Consequently, a synthetic chromaticity Wc2 on the blackbody locus BT is obtained as the synthetic chromaticity of the first white LED 21 and the second white LED 22.

As shown in FIG. 7, when time elapses from the start of use, due to the deterioration in the green phosphor among the phosphor 32 of the first white LED 21 and the phosphor 42 of the second white LED 22, let it be assumed that the chromaticity point In21 of the first white LED 21 and the chromaticity point In22 of the second white LED 22 respectively change in the moving direction 54, and become a chromaticity point Dt21 and a chromaticity point Dt22. Specifically, the chromaticity point of the first white LED 21 changes from the chromaticity point In21 to the chromaticity point Dt21, and approaches the blackbody locus BT in the moving direction 54. On the other hand, the chromaticity point of the second white LED 22 changes from the chromaticity point In22 to the chromaticity point Dt22, and moves away from the blackbody BT in the moving direction 54. However, the chromaticity point Dt21 of the first white LED 21 after deterioration and the chromaticity point Dt22 of the second white LED 22 after deterioration are still of a relationship of being positioned opposite each other across the blackbody locus BT on the xy chromaticity diagram.

In the foregoing case, the respective drive signals supplied from the drive signal generation circuit 25 to the first drive circuit 23 and the second drive circuit 24 are changed so that the current supplied from the first drive circuit 23 to the LED chip 31 of the first white LED 21 is decreased and the current supplied from the second drive circuit 24 to the LED chip 41 of the second white LED 22 is increased. And, a current of, for example, 100 mA is supplied from the first drive circuit 23 to the LED chip 31, and a current of 120 mA is supplied from the second drive circuit 24 to the LED chip 41. Consequently, the synthetic chromaticity Wc2 on the blackbody locus BT, that is, the same synthetic chromaticity as the beginning of use, is obtained as the synthetic chromaticity of the first white LED 21 and the second white LED 22. In other words, the first white LED 21 and the second white LED 22 change over time so that the respective chromaticities move on the straight line 53 that passes through the chromaticity point In21 of the first white LED 21 and the chromaticity point In22 of the second white LED 22. Consequently, even in cases where the first and second white LEDs 21, 22 deteriorate, the intersection point of the straight line that passes through the chromaticity point Dt21 of the first white LED 21 and the chromaticity point Dt22 of the second white LED 22 after deterioration, and the blackbody locus BT becomes constant (Wc2).

As described above, for instance, even when the green phosphor deteriorates and the chromaticity point In21 of the first white LED 21 and the chromaticity point In22 of the second white LED 22 at the beginning of use change in the moving direction 54 due to a temporal change, as with the foregoing embodiment, the synthetic chromaticity at the beginning of use can be maintained by respectively adjusting the currents supplied from the first drive circuit 23 and the second drive circuit 24.

Moreover, while the foregoing embodiment and FIG. 6 and FIG. 7 describe a case where the respective chromaticities of the first and second white LEDs 21, 22 has deteriorated in the same direction, the present implementation is not limited thereto. An example where the respective chromaticities of the first and second white LEDs 21, 22 deteriorate in a different direction is now described. Note that, in this case, the material forming the LED chips 31, 41 or the composition of the material forming the LED chips 31, 41 of the first and second white LEDs 21, 22 is mutually different, or the material forming the phosphors 32, 42 or the composition of the material forming the phosphors 32, 42 of the first and second white LEDs 21, 22 is mutually different.

Figure 8:
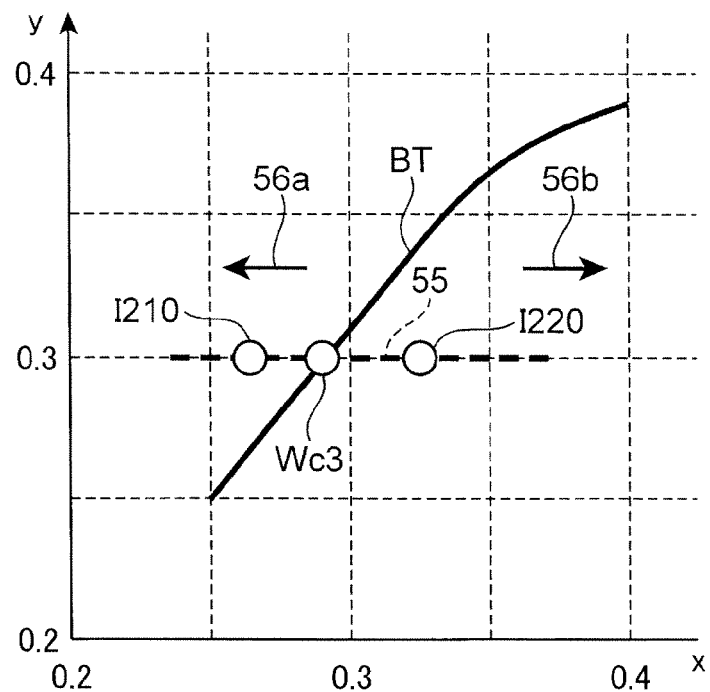
FIG. 8 is an xy chromaticity diagram of CIE showing yet another example of the chromaticity points at the beginning of use of the first and second white LEDs and the blackbody locus.
Figure 9:
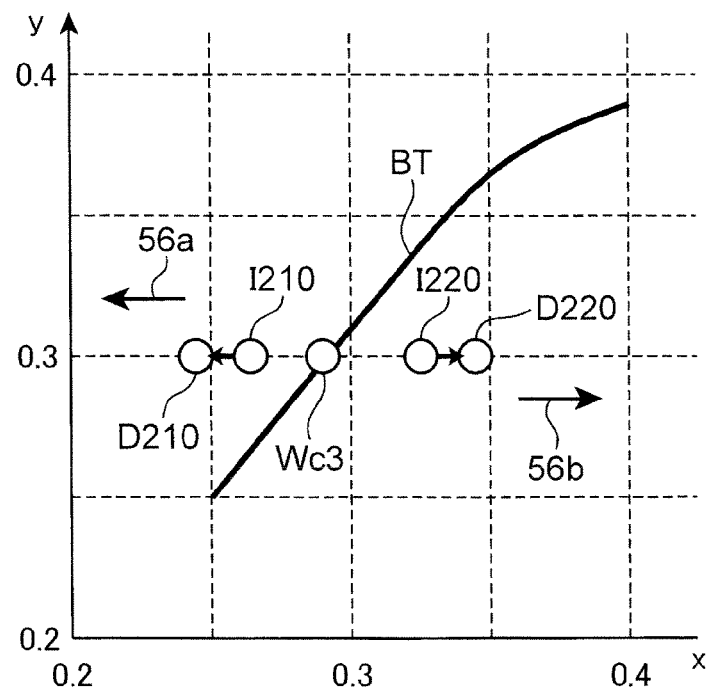
FIG. 9 is an xy chromaticity diagram of CIE showing the chromaticity points at the beginning of use of the first and second white LEDs of FIG. 8, the chromaticity points after a temporal change, and the blackbody locus.

FIG. 8 is an xy chromaticity diagram of CIE showing yet another example of the chromaticity points at the beginning of use of the first and second white LEDs 21, 22 and the blackbody locus. FIG. 9 is an xy chromaticity diagram of CIE showing the chromaticity points at the beginning of use of the first and second white LEDs 21, 22 of FIG. 8, the chromaticity points after a temporal change, and the blackbody locus. The correction method of the chromaticity points in this modified embodiment is now described with reference to FIG. 8 and FIG. 9.

As shown in FIG. 8, a chromaticity point I210 of the first white LED 21 at the beginning of use and a chromaticity point I220 of the second white LED 22 at the beginning of use are, as with the case of FIG. 4 and FIG. 6, of a relationship of being positioned opposite each other across the blackbody locus BT on the xy chromaticity diagram. In addition, a straight line 55 (broken line in FIG. 8) that passes through the chromaticity point I210 of the first white LED 21 and the chromaticity point I220 of the second white LED 22 is parallel to moving directions 56*a*, 56*b*, which are the directions that the chromaticity points I210, I220 of the first and second white LEDs 21, 22 move due to a temporal change on the xy chromaticity diagram.

However, the moving direction 56a on the xy chromaticity diagram of the chromaticity point I210 of the first white LED 21 due to a temporal change faces leftward in FIG. 8, and the moving direction 56b on the xy chromaticity diagram of the chromaticity point I220 of the second white LED 22 due to a temporal change faces rightward in FIG. 8. In other words, the chromaticity points I210, I220 of the first and second white LEDs 21, 22 move in opposite directions on the straight line 55 that passes through the chromaticity point I210 of the first white LED 21 and the chromaticity point I220 of the second white LED 22 due to a temporal change of the first and second white LEDs 21, 22.

In FIG. 8, at the beginning of use, a current of, for example, 50 mA is supplied from the first drive circuit 23 to the LED chip 31, and a current of 100 mA is supplied from the second drive circuit 24 to the LED chip 41. Consequently, a synthetic chromaticity Wc3 on the blackbody locus BT is obtained as the synthetic chromaticity of the first white LED 21 and the second white LED 22.

As shown in FIG. 9, when time elapses from the start of use, due to the deterioration in the phosphor 32 of the first white LED 21 and the phosphor 42 of the second white LED 22, let it be assumed that the chromaticity point I210 of the first white LED 21 changes in the moving direction 56a and becomes a chromaticity point D210, and that the chromaticity point I220 of the second white LED 22 changes in the moving direction 56b and becomes a chromaticity point D220. In other words, the chromaticity point of the first white LED 21 changes from the chromaticity point I210 to the chromaticity point D210 and moves away from the blackbody locus BT in the moving direction 56a. On the other hand, the chromaticity point of the second white LED 22 changes from the chromaticity point I220 to the chromaticity point D220, and similarly moves away from the blackbody locus BT in the moving direction 56b. However, the chromaticity point D210 of the first white LED 21 after deterioration and the chromaticity point D220 of the second white LED 22 after deterioration are still of a relationship of being positioned opposite each other across the blackbody locus BT on the xy chromaticity diagram.

In the foregoing case, the respective drive signals supplied from the drive signal generation circuit 25 to the first drive circuit 23 and the second drive circuit 24 are changed so that the current supplied from the first drive circuit 23 to the LED chip 31 of the first white LED 21 and the current supplied from the second drive circuit 24 to the LED chip 41 of the second white LED 22 are both increased. And, a current of, for example, 120 mA is supplied from the first drive circuit 23 to the LED chip 31, and a current of 150 mA is supplied from the second drive circuit 24 to the LED chip 41. Consequently, the synthetic chromaticity Wc3 on the blackbody locus BT, that is, the same synthetic chromaticity as the beginning of use, is obtained as the synthetic chromaticity of the first white LED 21 and the second white LED 22. In other words, the first white LED 21 and the second white LED 22 change over time so that the respective chromaticities move on the straight line 55 that passes through the blackbody locus BT and the chromaticity point I210 of the first white LED 21 and the chromaticity point I220 of the second white LED 22.

As described above, for instance, even when the phosphors made of mutually different materials or compositions deteriorate and the chromaticity point I210 of the first white LED 21 and the chromaticity point I220 of the second white LED 22 at the beginning of use change in the moving directions 56a, 56b, different from each other, due to a temporal change, in a case where the first white LED 21 and the second white LED 22 change over time so that the respective chromaticity points move on the straight line 55 that passes through the chromaticity point I210 of the first white LED 21 and the chromaticity point I220 of the second white LED 22, the synthetic chromaticity at the beginning of use can be maintained by respectively adjusting the currents supplied from the first drive circuit 23 and the second drive circuit 24, as with the foregoing embodiment.

Figure 10:
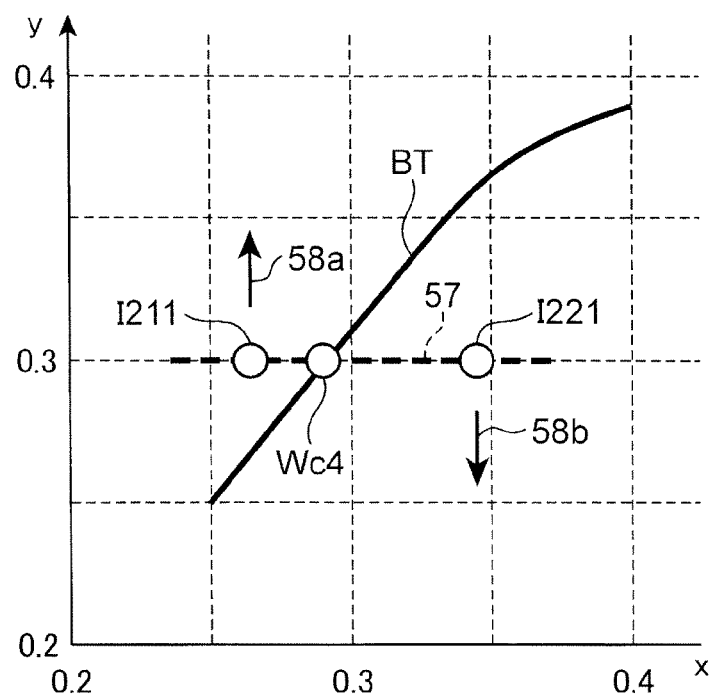
FIG. 10 is an xy chromaticity diagram of CIE showing still yet another example of the chromaticity points at the beginning of use of the first and second white LEDs and the blackbody locus.
Figure 11:
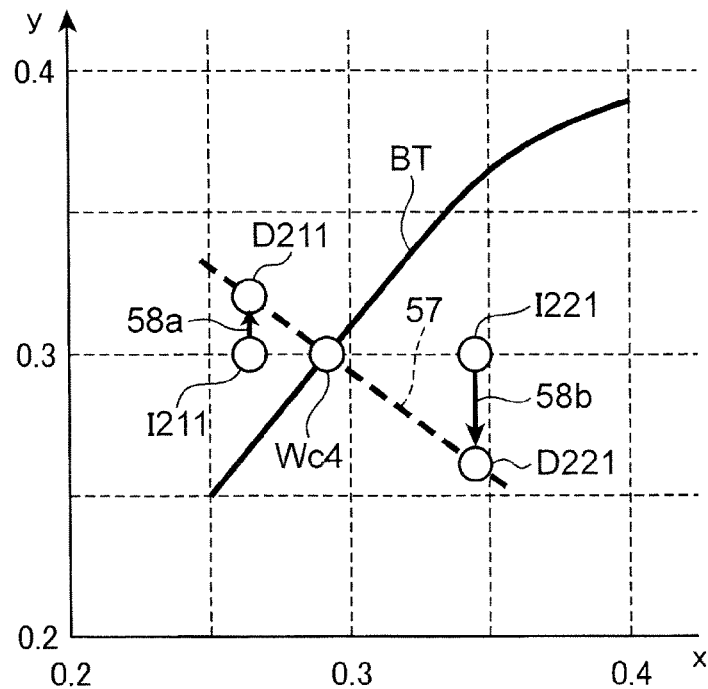
FIG. 11 is an xy chromaticity diagram of CIE showing the chromaticity points at the beginning of use of the first and second white LEDs of FIG. 10, the chromaticity points after a temporal change, and the blackbody locus.

FIG. 10 is an xy chromaticity diagram of CIE showing still yet another example of the chromaticity points at the beginning of use of the first and second white LEDs 21, 22 and the blackbody locus. FIG. 11 is an xy chromaticity diagram of CIE showing the chromaticity points at the beginning of use of the first and second white LEDs 21, 22 of FIG. 10, the chromaticity points after a temporal change, and the blackbody locus. The correction method of the chromaticity points in this modified embodiment is now described with reference to FIG. 10 and FIG. 11.

As shown in FIG. 10, a chromaticity point I211 of the first white LED 21 at the beginning of use and a chromaticity point I221 of the second white LED 22 at the beginning of use are, as with the case of FIG. 4 and FIG. 6, of a relationship of being positioned opposite each other across the blackbody locus BT on the xy chromaticity diagram. Meanwhile, a straight line 57 (broken line in FIG. 10) that passes through the chromaticity point I211 of the first white LED 21 and the chromaticity point I221 of the second white LED 22 is not parallel to moving directions 58a, 58b on the xy chromaticity diagram of the chromaticity points I211, I221 of the first and second white LEDs 21, 22 due to a temporal change. In other words, the moving direction 58a on the xy chromaticity diagram of the chromaticity point I211 of the first white LED 21 due to a temporal change faces upward in FIG. 10. On the other hand, the moving direction 58b on the xy chromaticity diagram of the chromaticity point I221 of the second white LED 22 due to a temporal change faces downward in FIG. 10.

In FIG. 10, at the beginning of use, a current of, for example, 50 mA is supplied from the first drive circuit 23 to the LED chip 31, and a current of 150 mA is supplied from the second drive circuit 24 to the LED chip 41. Consequently, a synthetic chromaticity Wc4 on the blackbody locus BT is obtained as the synthetic chromaticity of the first white LED 21 and the second white LED 22.

As shown in FIG. 11, when time elapses from the start of use, due to the deterioration in the phosphor 32 of the first white LED 21 and the phosphor 42 of the second white LED 22, let it be assumed that the chromaticity point I211 of the first white LED 21 changes in the moving direction 58a and becomes a chromaticity point D211, and that the chromaticity point I221 of the second white LED 22 changes in the moving direction 58b and becomes a chromaticity point D221. In other words, the chromaticity point of the first white LED 21 changes from the chromaticity point I211 to the chromaticity point D211 and moves away from the blackbody locus BT in the moving direction 58a. On the other hand, the chromaticity point of the second white LED 22 changes from the chromaticity point I221 to the chromaticity point D221, and moves away from the blackbody locus BT in the moving direction 58b. However, the chromaticity point D211 of the first white LED 21 after deterioration and the chromaticity point D221 of the second white LED 22 after deterioration are still of a relationship of being positioned opposite each other across the blackbody locus BT on the xy chromaticity diagram.

In the foregoing case, the respective drive signals supplied from the drive signal generation circuit 25 to the first drive circuit 23 and the second drive circuit 24 are changed so that the current supplied from the first drive circuit 23 to the LED chip 31 of the first white LED 21 and the current supplied from the second drive circuit 24 to the LED chip 41 of the second white LED 22 are both increased. And, a current of, for example, 80 mA is supplied from the first drive circuit 23 to the LED chip 31, and a current of 240 mA is supplied from the second drive circuit 24 to the LED chip 41. Consequently, the synthetic chromaticity Wc4 on the blackbody locus BT, that is, the same synthetic chromaticity as the beginning of use, is obtained as the synthetic chromaticity of the first white LED 21 and the second white LED 22. In other words, the first white LED 21 and the second white LED 22 change over time so that the intersection point (that is, Wc4) of the blackbody locus BT and the straight line 57 that passes through the chromaticity point I211 of the first white LED 21 and the chromaticity point I221 of the second white LED 22 becomes constant on the xy chromaticity diagram. Specifically, the intersection point of the blackbody locus BT, and the straight line 57 that passes through the chromaticity point D211 of the first white LED 21 and the chromaticity point D221 of the second white LED 22 after deterioration becomes constant (Wc4) on the xy chromaticity diagram.

As described above, for instance, even when the phosphors made of mutually different materials or compositions deteriorate and the chromaticity point I211 of the first white LED 21 and the chromaticity point I221 of the second white LED 22 at the beginning of use change in the moving directions 58*a*, 58*b*, different from each other, due to a temporal change, in a case where the intersection point (that is, Wc4) of the blackbody locus BT and the straight line 57 that passes through the chromaticity point D211 of the first white LED 21 and the chromaticity point D221 of the second white LED 22 is constant on the xy chromaticity diagram, the synthetic chromaticity at the beginning of use can be maintained by respectively adjusting the currents supplied from the first drive circuit 23 and the second drive circuit 24, as with the foregoing embodiment.

Moreover, while the backlight unit 12 is an edge-light type backlight unit in the foregoing embodiment as shown in FIG. 2, the present implementation is not limited thereto, and may also be a direct-type backlight unit.

Figure 12A:
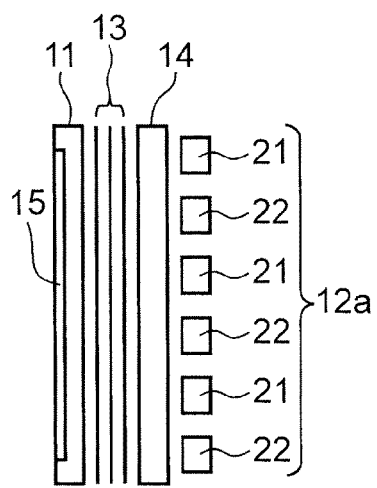
Figure 12B:
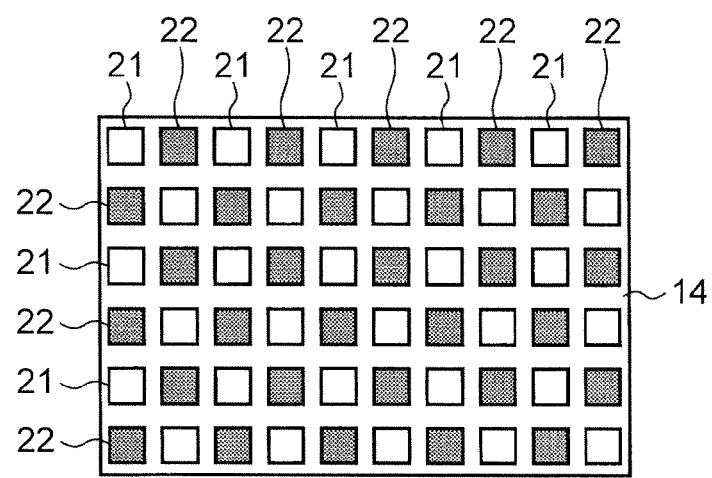

FIGS. 12A and 12B are diagrams showing the liquid crystal display panel comprising a direct-type backlight unit 12*a*, wherein FIG. 12A is a side view and FIG. 12B is a rear view. In this case also, the same effect as the foregoing embodiment can be obtained. Moreover, as shown in FIG. 12A and FIG. 12B, the first white LED 21 and the second white LED 22 are disposed alternately. Based on this arrangement, as with the foregoing embodiment, there is an advantage in that the color unevenness caused by the difference in the chromaticity point of the first white LED 21 and the chromaticity point of the second white LED 22 will not be conspicuous.

Moreover, in the foregoing embodiment, while the first drive circuit 23 and the second drive circuit 24 respectively adjust the supply current to the first white LED 21 and the second white LED 22 based on the drive signals output from the drive signal generation circuit 25, various modifications may be adopted for this configuration. For example, the configuration may also be such that the display control circuit 3 controls the drive signal generation circuit 25 to change the drive signals that are output from the drive signal generation circuit 25. Otherwise, the configuration may also be such that the drive signal generation circuit 25 is omitted, and the display control circuit 3 directly controls the first drive circuit 23 and the second drive circuit 24. In addition, the configuration may also be such that a switch or a variable resistance is provided in the drive signal generation circuit 25 in advance, and the drive signals are changed from the outside based on the ON/OFF of the switch or change of the resistance value of the variable resistance from the outside. Furthermore, the configuration may also be such that the drive signal generation circuit 25 is omitted, and a switch or a variable resistance is provided to the first drive circuit 23 and the second drive circuit 24 in advance, and directly adjusting the supply current from the outside based on the ON/OFF of the switch or change of the resistance value of the variable resistance from the outside.

The specific embodiments described above mainly include the liquid crystal display and the liquid crystal display device configured as described below.

In one general aspect, the instant application describes a liquid crystal display panel that includes a liquid crystal display unit that includes a display screen that displays an image; and a backlight unit that illuminates the liquid crystal display unit from a rear face of the liquid crystal display unit. The backlight unit includes: a first white light-emitting diode and a second white light-emitting diode that respectively emit white light; a first drive unit that supplies a current to the first white light-emitting diode; and a second drive unit that supplies a current to the second white light-emitting diode, the first drive unit is configured to be able to adjust a supply current to the first white light-emitting diode, the second drive unit is configured to be able to adjust a supply current to the second white light-emitting diode, a chromaticity of the first white light-emitting diode and a chromaticity of the second white light-emitting diode are of a relationship of being positioned opposite each other across a blackbody locus on an xy chromaticity diagram, and the first white light-emitting diode and the second white light-emitting diode change over time so that, on the xy chromaticity diagram, an intersection point of the blackbody locus and a line that passes through the chromaticity of the first white light-emitting diode and the chromaticity of the second white light-emitting diode becomes constant.

According to the foregoing configuration, the liquid crystal display unit includes a display screen that displays an image. The backlight unit illuminates the liquid crystal display unit from a rear face of the liquid crystal display unit. The first white light-emitting diode and the second white light-emitting diode respectively emit white light. The first drive unit supplies a current to the first white light-emitting diode. The second drive unit supplies a current to the second white light-emitting diode. The first drive unit is configured to be able to adjust a supply current to the first white light-emitting diode. The second drive unit is configured to be able to adjust a supply current to the second white light-emitting diode. The chromaticity of the first white light-emitting diode and the chromaticity of the second white light-emitting diode are of a relationship of being positioned opposite each other across a blackbody locus on an xy chromaticity diagram. Accordingly, by adjusting the supply current from the first drive unit to the first white light-emitting diode and adjusting the supply current from the second drive unit to the second white light-emitting diode, the synthetic chromaticity of the chromaticity of the first white light-emitting diode and the chromaticity of the second white light-emitting diode can be made to coincide with the blackbody locus on the xy chromaticity diagram.

Moreover, the first white light-emitting diode and the second white light-emitting diode change over time so that, on the xy chromaticity diagram, an intersection point of the blackbody locus and a line that passes through the chromaticity of the first white light-emitting diode and the chromaticity of the second white light-emitting diode becomes constant. Accordingly, since the foregoing intersection point is constant even when the first and second white light-emitting diodes change over time, by adjusting the supply current from the first drive unit to the first white light-emitting diode and adjusting the supply current from the second drive unit to the second white light-emitting diode, the synthetic chromaticity of the chromaticity of the first white light-emitting diode and the chromaticity of the second white light-emitting diode can be made to coincide with the foregoing intersection point. Consequently, even when the respective chromaticities of the first and second white light-emitting diodes move on the xy chromaticity diagram due to a temporal change, it is possible to prevent the synthetic chromaticity of the light from the backlight unit from changing.

The above general aspect may include one or more of the following features. The first drive unit may adjust a supply current to the first white light-emitting diode and the second drive unit may adjust a supply current to the second white light-emitting diode so that a chromaticity of the light emitted from the backlight unit becomes constant.

According to the foregoing configuration, the first drive unit adjusts the supply current to the first white light-emitting diode and the second drive unit adjusts the supply current to the second white light-emitting diode so that the chromaticity of the light emitted from the backlight unit becomes constant. Accordingly, it is possible to reliably prevent the synthetic chromaticity of the light emitted from the backlight unit from changing.

The first white light-emitting diode and the second white light-emitting diode may change over time so that, on the xy chromaticity diagram, the chromaticity of the first white light-emitting diode and the chromaticity of the second white light-emitting diode move on the line that passes through the chromaticity of the first white light-emitting diode and the chromaticity of the second white light-emitting diode.

According to the foregoing configuration, the first white light-emitting diode and the second white light-emitting diode change over time so that, on the xy chromaticity diagram, the chromaticity of the first white light-emitting diode and the chromaticity of the second white light-emitting diode move on the line that passes through the chromaticity of the first white light-emitting diode and the chromaticity of the second white light-emitting diode. Accordingly, the intersection point of the line that passes through the chromaticity of the first white light-emitting diode and the chromaticity of the second white light-emitting diode and the blackbody locus will be constant on the xy chromaticity diagram, even when the first white light-emitting diode and the second white light-emitting diode change over time. Consequently, even when the first and second white light-emitting diodes change over time, by adjusting the supply current from the first drive unit to the first white light-emitting diode and adjusting the supply current from the second drive unit to the second white light-emitting diode, the synthetic chromaticity of the chromaticity of the first white light-emitting diode and the chromaticity of the second white light-emitting diode can be made to coincide with a constant intersection point of the blackbody locus on the xy chromaticity diagram. Consequently, even when the respective chromaticities of the first and second white light-emitting diodes move on the xy chromaticity diagram due to a temporal change, it is possible to prevent the synthetic chromaticity of the light from the backlight unit from changing.

The first white light-emitting diode and the second white light-emitting diode respectively may include: a light-emitting diode chip that emits light of a predetermined wavelength; and a phosphor that absorbs a part of the light emitted from the light-emitting diode chip to emit light of a wavelength different from the predetermined wavelength, a material forming the respective light-emitting diode chips of the first white light-emitting diode and the second white light-emitting diode and a composition of the material forming the light-emitting diode chips are mutually the same, and a material forming the respective phosphors of the first white light-emitting diode and the second white light-emitting diode and a composition of the material forming the phosphors are mutually the same.

According to the foregoing configuration, the first white light-emitting diode and the second white light-emitting diode respectively include a light-emitting diode chip and a phosphor. The light-emitting diode chip emits light of a predetermined wavelength. The phosphor absorbs a part of the light emitted from the light-emitting diode chip to emit light of a wavelength different from the predetermined wavelength. The material forming the respective light-emitting diode chips of the first white light-emitting diode and the second white light-emitting diode and the composition of the material forming the light-emitting diode chips are mutually the same. Accordingly, a change in the wavelength of the light that is emitted from the light-emitting diode chip caused by the temporal change of the light-emitting diode chip will be mutually the same in the first white light-emitting diode and the second white light-emitting diode. Moreover, the material forming the respective phosphors of the first white light-emitting diode and the second white light-emitting diode and the composition of the material forming the phosphors are mutually the same. Accordingly, a change in the wavelength of the light that is emitted from the phosphor caused by the temporal change of the phosphor will be mutually the same in the first white light-emitting diode and the second white light-emitting diode. Consequently, the chromaticity of the first white light-emitting diode and the chromaticity of the second white light-emitting diode will move in the same direction on the xy chromaticity diagram due to the respective temporal changes of the first white light-emitting diode and the second white light-emitting diode. Consequently, even when the respective chromaticities of the first and second white light-emitting diodes change due to the temporal change of the first and second white light-emitting diodes, it is possible to reliably prevent the synthetic chromaticity of the illumination light illuminating the liquid crystal display unit from changing.

The liquid crystal display panel may further include a light guide plate that is disposed on a rear face side of the display screen of the liquid crystal display unit and guides incident light to the display screen. The first white light-emitting diode and the second white light-emitting diode are alternately disposed at a side of the light guide plate opposite to the display screen facing the light guide plate, and emit the white light toward the light guide plate.

According to the foregoing configuration, the light guide plate is disposed on a rear face side of the display screen of the liquid crystal display unit and guides incident light to the display screen. The first white light-emitting diode and the second white light-emitting diode are alternately disposed along at least one end part of the light guide plate, and emit the white light toward the end part. Accordingly, the display screen can be suitably illuminated from the rear face by the respective white light emitted from the first white light-emitting diode and the second white light-emitting diode via the light guide plate. Moreover, since the first white light-emitting diode and the second white light-emitting diode are alternately disposed along at least one end part of the light guide plate, there is an advantage in that the difference in the chromaticities of the respective white light of the first white light-emitting diode and the second white light-emitting diode will not be conspicuous.

The liquid crystal display panel may further include a light guide plate that is disposed on a rear face side of the display screen of the liquid crystal display unit and guides incident light to the display screen. The first white light-emitting diode and the second white light-emitting diode may be alternately disposed at a side of the light guide plate opposite to the display screen facing the light guide plate, and emit the white light toward the light guide plate.

According to the foregoing configuration, the light guide plate is disposed on a rear face side of the display screen of the liquid crystal display unit and guides incident light to the display screen. The first white light-emitting diode and the second white light-emitting diode are alternately disposed at a side of the light guide plate opposite to the display screen facing the light guide plate, and emit the white light toward the light guide plate. Accordingly, the display screen can be suitably illuminated from the rear face by the respective white light emitted from the first white light-emitting diode and the second white light-emitting diode. Moreover, since the first white light-emitting diode and the second white light-emitting diode are alternately disposed, there is an advantage in that the difference in the chromaticities of the respective white light of the first white light-emitting diode and the second white light-emitting diode will not be conspicuous.

In another general aspect, the instant application describes a liquid crystal display device that includes the liquid crystal display panel and a control circuit that controls the liquid crystal display unit of the liquid crystal display panel based on an input image signal.

According to the foregoing configuration, the above-described liquid crystal display panel is provided, and the control circuit controls the liquid crystal display unit of the liquid crystal display panel based on an input image signal. Since the above-described liquid crystal display panel is provided, it is possible to inhibit the synthetic chromaticity of the light emitted from the backlight unit from changing, even when the respective chromaticities of the first and second white light-emitting diodes change due to the temporal change of the first and second white light-emitting diodes. Consequently, it is possible to inhibit the display quality of images displayed on the display screen of the liquid crystal display unit from deteriorating due to a temporal change.

INDUSTRIAL APPLICABILITY

In a liquid crystal display panel and a liquid crystal display device which display images on a liquid crystal display unit, the present implementation is effective as a liquid crystal display panel and a liquid crystal display device capable of preventing changes in the synthetic chromaticity of the light that illuminates the liquid crystal display unit from the backlight unit even when the respective chromaticities of the first and second white light-emitting diodes move on the xy chromaticity diagram due to a temporal change.

This application is based on Japanese Patent application No. 2011-273569 filed in Japan Patent Office on Dec. 14, 2011, the contents of which are hereby incorporated by reference.

Although the present application has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A liquid crystal display panel, comprising:
a liquid crystal display unit that includes a display screen that displays an image; and
a backlight unit that illuminates the liquid crystal display unit from a rear face of the liquid crystal display unit, wherein:
the backlight unit includes:
   a first white light-emitting diode and a second white light-emitting diode that respectively emit white light;
   a first drive unit that supplies a current to the first white light-emitting diode; and
   a second drive unit that supplies a current to the second white light-emitting diode,
the first drive unit is configured to be able to adjust a supply current to the first white light-emitting diode,
the second drive unit is configured to be able to adjust a supply current to the second white light-emitting diode,
a chromaticity point of the first white light-emitting diode and a chromaticity point of the second white light-emitting diode are of a relationship of being positioned opposite each other across a blackbody locus on an xy chromaticity diagram,
the first white light-emitting diode emits first white light corresponding to a first chromaticity point at a first point of time, and second white light corresponding to a second chromaticity point at a second point of time later than the first point of time,
the second white light-emitting diode emits third white light corresponding to a third chromaticity point at the first point of time, and fourth white light corresponding to a fourth chromaticity point at the second point of time,
a first line that passes through the first chromaticity point and the third chromaticity point intersects, on the xy chromaticity diagram, the blackbody locus at an intersection point,
a second line that passes through the second chromaticity point and the fourth chromaticity point intersects, on the xy chromaticity diagram, the blackbody locus at the intersection point, and
at least one of the first chromaticity point and the third chromaticity point is closer to the intersection point than the second chromaticity point and the fourth chromaticity point, respectively,
the first white light emitting diode includes:
   a first light-emitting diode chip; and
   a first phosphor and
the second white light-emitting diode includes:
   a second light-emitting diode chip; and
   a second phosphor.

2. The liquid crystal display panel according to claim 1, wherein the first drive unit adjusts a supply current to the first white light-emitting diode and the second drive unit adjusts a supply current to the second white light-emitting diode so that a chromaticity of the light emitted from the backlight unit becomes constant.

3. The liquid crystal display panel according to claim 1, further comprising a light guide plate that is disposed on a rear face side of the display screen of the liquid crystal display unit and guides incident light to the display screen, wherein:
plural first white light-emitting diodes and plural second white light-emitting diodes are provided, and
the plural first white light-emitting diodes and the plural second white light-emitting diodes are alternately disposed along at least one end part of the light guide plate, and emit the white light toward the end part.

4. The liquid crystal display panel according to claim 1, further comprising a light guide plate that is disposed on a rear face side of the display screen of the liquid crystal display unit and guides incident light to the display screen, wherein:
- plural first white light-emitting diodes and plural second white light-emitting diodes are provided, and
- the plural first white light-emitting diodes and the plural second white light emitting diodes are alternately disposed at a side of the light guide plate opposite to the display screen facing the light guide plate, and emit the white light toward the light guide plate.

5. A liquid crystal display device, comprising:
- the liquid crystal display panel according to claim 1; and
- a control circuit that controls the liquid crystal display unit of the liquid crystal display panel based on an input image signal.

6. The liquid crystal display panel according to claim 1, wherein, on the xy chromaticity diagram, the second chromaticity point and the fourth chromaticity point are not positioned on the first line.

7. The liquid crystal display panel according to claim 1, wherein a plurality of white light-emitting diodes included in the backlight unit consist of a plurality of first white light-emitting diodes and a plurality of second white light-emitting diodes.

8. The liquid crystal display panel according to claim 1, wherein, on the xy chromaticity diagram, the second chromaticity point and the fourth chromaticity point are positioned on the first line.

9. The liquid crystal display panel according to claim 8, wherein:
- a composition of a material forming the first light-emitting diode chip and a composition of a material forming the second light-emitting diode chip are the same, and
- a composition of a material forming the first phosphor and a composition of a material of a second phosphor are the same.

10. The liquid crystal display panel according to claim 8, wherein, on the xy chromaticity diagram, the second chromaticity point is closer to the intersection point than the first chromaticity point and the third chromaticity point is closer to the intersection point than the fourth chromaticity point.

11. The liquid crystal display panel according to claim 8, wherein, on the xy chromaticity diagram, the first chromaticity point is closer to the intersection point than the second chromaticity point, and the third chromaticity point is closer to the intersection point than the fourth chromaticity point.

12. A liquid crystal display panel, comprising:
- a liquid crystal display unit that includes a display screen that displays an image; and
- a backlight unit that illuminates the liquid crystal display unit from a rear face of the liquid crystal display unit, wherein:
- the backlight unit includes:
  - a first white light-emitting diode and a second white light-emitting diode that respectively emit white light;
  - a first drive unit that supplies a current to the first white light-emitting diode; and
  - a second drive unit that supplies a current to the second white light-emitting diode,
- the first drive unit is configured to be able to adjust a supply current to the first white light-emitting diode,
- the second drive unit is configured to be able to adjust a supply current to the second white light-emitting diode,
- a chromaticity point of the first white light-emitting diode and a chromaticity point of the second white light-emitting diode are of a relationship of being positioned opposite each other across a blackbody locus on an xy chromaticity diagram,
- the first white light-emitting diode emits first white light corresponding to a first chromaticity point at a first point of time, and second white light corresponding to a second chromaticity point at a second point of time later than the first point of time,
- the second white light-emitting diode emits third white light corresponding to a third chromaticity point at the first point of time, and fourth white light corresponding to a fourth chromaticity point at the second point of time,
- a first line that passes through the first chromaticity point and the third chromaticity point intersects, on the xy chromaticity diagram, the blackbody locus at an intersection point,
- a second line that passes through the second chromaticity point and the fourth chromaticity point intersects, on the xy chromaticity diagram, the blackbody locus at the intersection point, and
- at least one of the second chromaticity point and the fourth chromaticity point is closer to the intersection point than the first chromaticity point and the third chromaticity point, respectively,
- the first white light emitting diode includes:
  - a first light-emitting diode chip; and
  - a first phosphor and
- the second white light-emitting diode includes:
  - a second light-emitting diode chip; and
  - a second phosphor.

13. The liquid crystal display panel according to claim 12, wherein the first drive unit adjusts a supply current to the first white light-emitting diode and the second drive unit adjusts a supply current to the second white light-emitting diode so that a chromaticity of the light emitted from the backlight unit becomes constant.

14. The liquid crystal display panel according to claim 12, further comprising a light guide plate that is disposed on a rear face side of the display screen of the liquid crystal display unit and guides incident light to the display screen, wherein:
- plural first white light-emitting diodes and plural second white light-emitting diodes are provided, and
- the plural first white light-emitting diodes and the plural second white light-emitting diodes are alternately disposed along at least one end part of the light guide plate, and emit the white light toward the end part.

15. The liquid crystal display panel according to claim 12, further comprising a light guide plate that is disposed on a rear face side of the display screen of the liquid crystal display unit and guides incident light to the display screen, wherein:
- plural first white light-emitting diodes and plural second white light-emitting diodes are provided, and
- the plural first white light-emitting diodes and the plural second white light-emitting diodes are alternately disposed at a side of the light guide plate opposite to the display screen facing the light guide plate, and emit the white light toward the light guide plate.

16. A liquid crystal display device, comprising:
- the liquid crystal display panel according to claim 12; and
- a control circuit that controls the liquid crystal display unit of the liquid crystal display panel based on an input image signal.

17. The liquid crystal display panel according to claim 12, wherein a plurality of white light-emitting diodes included in the backlight unit consist of a plurality of first white light-emitting diodes and a plurality of second white light-emitting diodes.

18. The liquid crystal display panel according to claim 12, wherein on the xy chromaticity diagram, the second chromaticity point and the fourth chromaticity point are positioned on the first line.

19. The liquid crystal display panel according to claim 18, wherein:
- a composition of a material forming the first light-emitting diode chip and a composition of a material forming the second light-emitting diode chip are the same, and
- a composition of a material forming the first phosphor and a composition of a material of a second phosphor are the same.

* * * * *